United States Patent
Lung et al.

(10) Patent No.: US 7,612,298 B2
(45) Date of Patent: Nov. 3, 2009

(54) CONNECTING UNIT FOR WICK OF COLD CATHODE FLUORESCENT LAMP

(75) Inventors: Sheng-Chieh Lung, Taoyuan County (TW); Mau-Yuan Hung, Taipei County (TW)

(73) Assignee: AU Optronics Corp., Hsin-Chu (TW)

( * ) Notice: Subject to any disclaimer, the term of this patent is extended or adjusted under 35 U.S.C. 154(b) by 359 days.

(21) Appl. No.: 11/614,985

(22) Filed: Dec. 22, 2006

(65) Prior Publication Data

US 2008/0096411 A1   Apr. 24, 2008

(30) Foreign Application Priority Data

Jul. 20, 2006   (TW) .............................. 95126489 A

(51) Int. Cl.
*H01B 17/16* (2006.01)
(52) U.S. Cl. ...................... 174/262; 439/226; 439/235; 439/239; 439/698; 362/614; 362/217.01; 362/217.08; 362/225; 362/260
(58) Field of Classification Search ................. 174/262; 439/226, 235, 239, 698; 313/491–493, 495–497, 313/634; 362/614, 217.01, 217.08, 225, 362/260
See application file for complete search history.

(56) References Cited

U.S. PATENT DOCUMENTS

| | | | | |
|---|---|---|---|---|
| 5,608,288 A | * | 3/1997 | Haag | 313/612 |
| 5,855,487 A | * | 1/1999 | Kunishi | 439/232 |
| 7,011,428 B1 | * | 3/2006 | Hand | 362/217.05 |
| 7,387,419 B2 | * | 6/2008 | Jeong et al. | 362/561 |
| 2001/0019481 A1 | * | 9/2001 | Bartenbach | 362/217 |
| 2006/0061982 A1 | | 3/2006 | Lee | |
| 2006/0245186 A1 | * | 11/2006 | Stillman | 362/225 |
| 2007/0081322 A1 | * | 4/2007 | Choi et al. | 362/97 |

FOREIGN PATENT DOCUMENTS

| | | |
|---|---|---|
| TW | M248097 | 10/2004 |
| TW | M258233 | 3/2005 |
| TW | I243517 | 11/2005 |
| TW | M275426 | 11/2005 |
| TW | I258253 | 7/2006 |

\* cited by examiner

*Primary Examiner*—Dean A. Reichard
*Assistant Examiner*—Abiy Gatachew
(74) *Attorney, Agent, or Firm*—Winston Hsu

(57) ABSTRACT

A connecting unit for accommodating a wick of a cold cathode fluorescent lamp is disclosed. The connecting unit includes a substrate having a conductive layer disposed thereon, a v-shaped opening, and a c-shaped opening. The width of the front end of the v-shaped opening is greater than the diameter of the wick, and the width of the back end of the v-shaped opening is less than the diameter of the c-shaped opening and less than the diameter of the wick. The conductive layer is disposed on a surface of the c-shaped opening and the v-shaped opening.

10 Claims, 6 Drawing Sheets

CONNECTING UNIT FOR WICK OF COLD CATHODE FLUORESCENT LAMP

BACKGROUND OF THE INVENTION

1. Field of the Invention

The invention relates to a connecting unit for a wick of cold cathode fluorescent lamp.

2. Description of the Prior Art

Liquid crystal displays (LCDs) have become popular due to their small size, thin thickness, low power consumption, no radiation, and long life expectancy. They have been widely applied in desktop computers, notebook computers, personal digital assistants (PDA), cellular phones, and other electronic devices. Liquid crystal displays are also gradually replacing the cathode ray tube (CRT) monitors and traditional televisions. Since the liquid crystal displays do not emit light by themselves, a backlight unit is installed at the backside of the panel for providing light to display images.

Backlight units are typically composed of a plurality of cold cathode fluorescent lamps for increasing their overall brightness. In order to reduce cost and incorporate a power converter, a connecting unit, such as a conductor or a printed circuit board, is often provided to accommodate the wicks of the lamps.

Taiwan Patent No. 258233 discloses a connecting unit for the cold cathode fluorescent lamps, in which the connecting unit is shown in FIG. 1. As shown in FIG. 1, a plurality of cold cathode fluorescent lamps 10 and a connecting unit 14 for supporting the wicks 12 of the lamps 10 are provided. Specifically, the connecting unit 14 includes a plurality of holes 16 for accommodating the wicks 12. The conventional means of connecting the lamps 10 and the connecting unit 14 mainly involves utilizing the wicks 12 of the lamps 10 to penetrate the holes 16 of the connecting unit 14, and performing a soldering process to fix the wicks 12 onto the connecting unit 14. However, if either the lamps 10 or the connecting unit 14 is damaged during the assembly, testing, or transportation process, the lamps 10 must be detached from the connecting unit 14 for repairing or providing a room for the replacing unit. The presence of the holes 16 on the connecting unit 14 ultimately increases the difficulty for detaching the lamps 10 from the connecting unit 14, which may even cause further damage to the connecting unit 14 or to the lamps 10.

Hence, another connecting unit has been introduced to improve the aforementioned problems. Please refer to FIG. 2. FIG. 2 is illustrates another connecting unit for the cold cathode fluorescent lamps according to the prior art. As shown in FIG. 2, a plurality of cold cathode fluorescent lamps 20 and a connecting unit 24 for supporting the wicks 22 of the lamps 20 are provided. The connecting unit 24 includes a plurality of openings 26 for accommodating the wicks 22 of the cold cathode fluorescent lamps 20. By utilizing the openings 26, the wicks 22 can be easily detached from the connecting unit 24, thereby reducing damages to the wicks 22 of the lamps 20 while the wicks are detaching from the connecting unit 24.

Nevertheless, the connecting unit 24 shown in FIG. 2 still causes another drawback. In general, cold cathode fluorescent lamps 20 are driven by high voltages to generate light. As the lamps 20 are driven by high voltages, the wicks 22 of the lamps will generate a significant amount of heat. Since the lamps 20 are typically attached to the connecting unit 24 via a soldering process, the heat generated by the wicks 22 will ultimately melt the solder material and cause the wicks 22 to slip out of the connecting unit 24. The situation becomes worse when the liquid crystal display is designed vertically, and the result will often cause the malfunction of the lamps 20.

SUMMARY OF THE INVENTION

It is an objective of the present invention to provide a connecting unit for the wick of cold fluorescent lamps for solving the aforementioned problems.

A connecting unit for accommodating a wick of a cold cathode fluorescent lamp is disclosed. The connecting unit includes a substrate having a conductive layer, a v-shaped opening, and a c-shaped opening. Preferably, the back end of the v-shaped opening is connected to the c-shaped opening, the width of the front end of the v-shaped opening is greater than the diameter of the wick, the width of the back end of v-shaped opening is less than the diameter of the c-shaped opening and the width of the wick, and the conductive layer is disposed on a surface of the c-shaped opening and the v-shaped opening.

Preferably, the present invention forms a v-shaped opening in a printed circuit board, in which the end of the v-shaped opening is connected to a c-shaped opening. Specifically, when a cold cathode fluorescent lamp is placed on the v-shaped opening, a force can be applied to push the wick of the lamp into the c-shaped opening. Since the diameter of the c-shaped opening is greater than or equal to the diameter of the wick, the wick can be securely positioned in the c-shaped opening.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
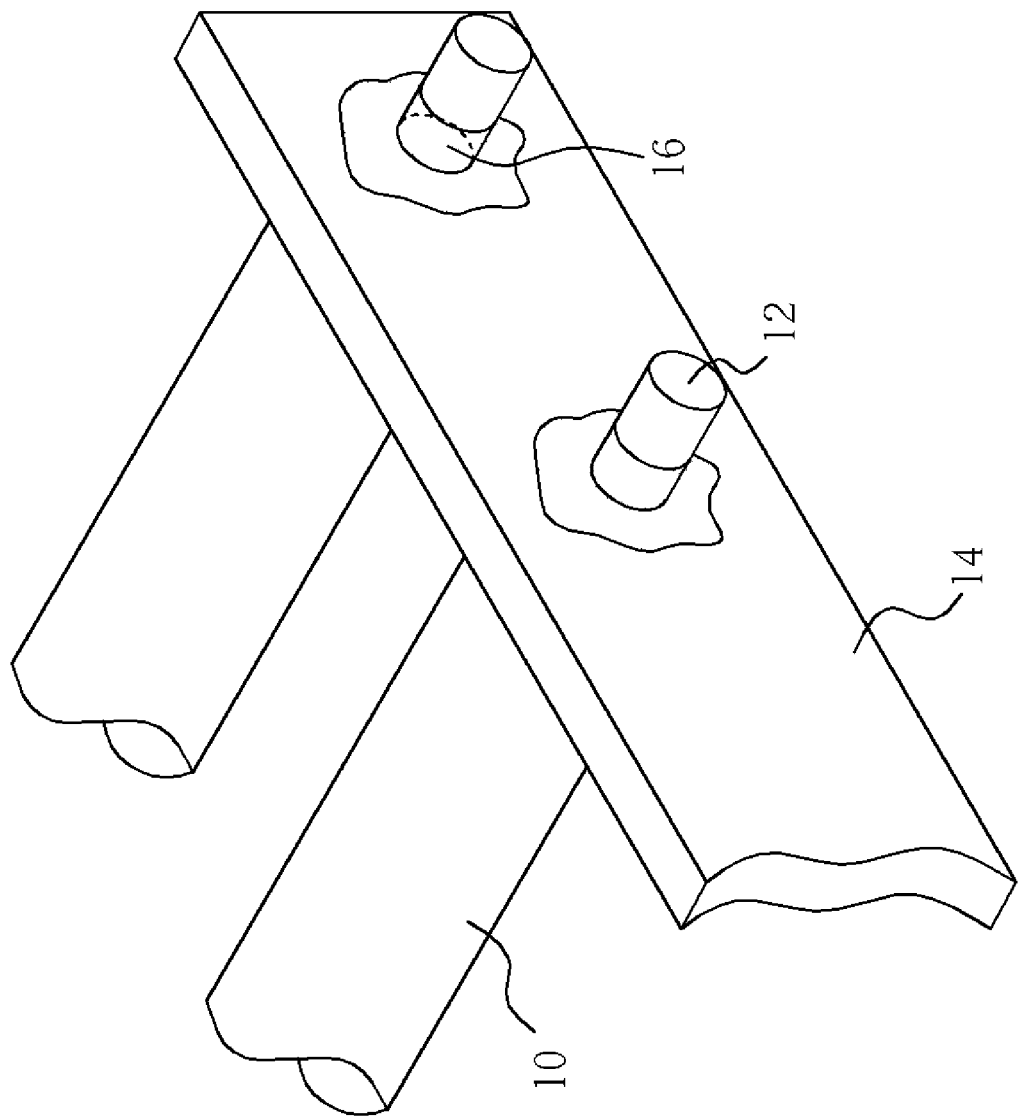
FIG. 1 is a perspective diagram illustrating a connecting unit for the cold cathode fluorescent lamps according to the prior art.
Figure 2:
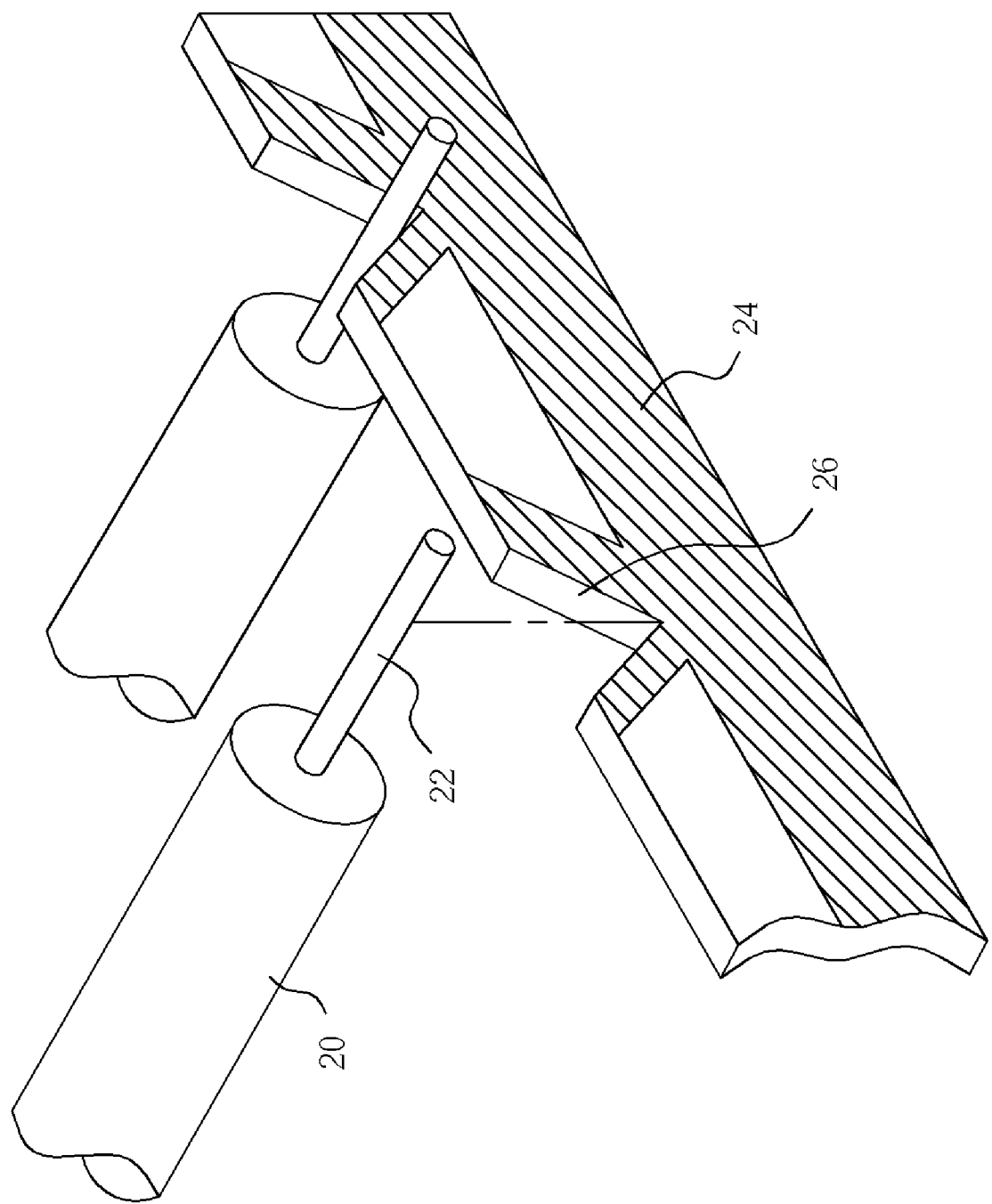
FIG. 2 is a perspective diagram illustrating a connecting unit for the cold cathode fluorescent lamps according to the prior art.
Figure 3:
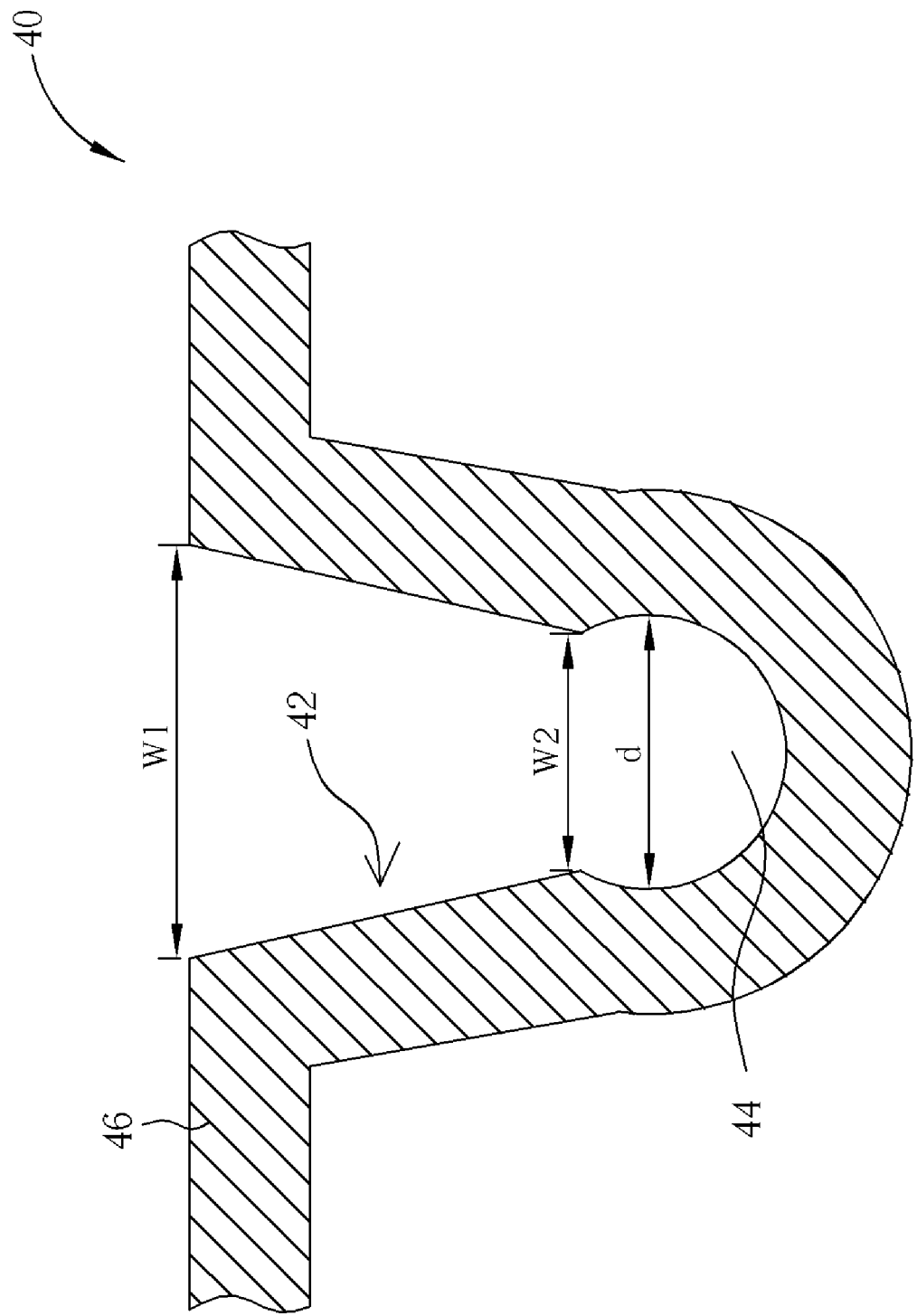
FIG. 3 is a perspective diagram illustrating a connecting unit for the wick of cold cathode fluorescent lamp according to the preferred embodiment of the present invention.

Please refer to FIG. 3. FIG. 3 is a perspective diagram illustrating a connecting unit for the wick of cold cathode fluorescent lamp according to the preferred embodiment of the present invention. Preferably, the connecting unit is a conductive device, such as a printed circuit board 40.

The printed circuit board 40 includes a v-shaped opening 42 thereon, in which the back end of the v-shaped opening 42 is connected to a c-shaped opening 44. A conductive layer 46 is deposited on the surface of the v-shaped opening 42 and the c-shaped opening 44, and a PCB connecting circuit (not shown) is disposed on an edge of the printed circuit board 40 and connected to the conductive layer 46 of the c-shaped opening. Specifically, the c-shaped opening 44 includes a diameter d, the front end of the v-shaped opening 42 includes a width w1, the back end of the v-shaped opening 42 includes a width w2, and the diameter d of the c-shaped opening 44 is greater than or equal to the diameter of the wick of a cold cathode fluorescent lamp.

Preferably, the width w1 of the front end of the v-shaped opening 42 is greater than the diameter d of the c-shaped opening 44, in which w1 is approximately 10% to 50% greater than d. For instance, if the diameter d of the c-shaped opening 44 is 0.5 mm, the width w1 of the front end of the v-shaped opening 42 is approximately between 0.55 mm to 0.75 mm.

Additionally, the diameter d of the c-shaped opening 44 is greater than the width w2 of the back end of the v-shaped opening 42, in which w2 is approximately 0.5% to 10% less than d. For instance, if the diameter d of the c-shaped opening 44 is 0.5 mm, the width w2 of the back end of the v-shaped opening 42 is approximately between 0.45 mm to 0.4975 mm.

Figure 4:
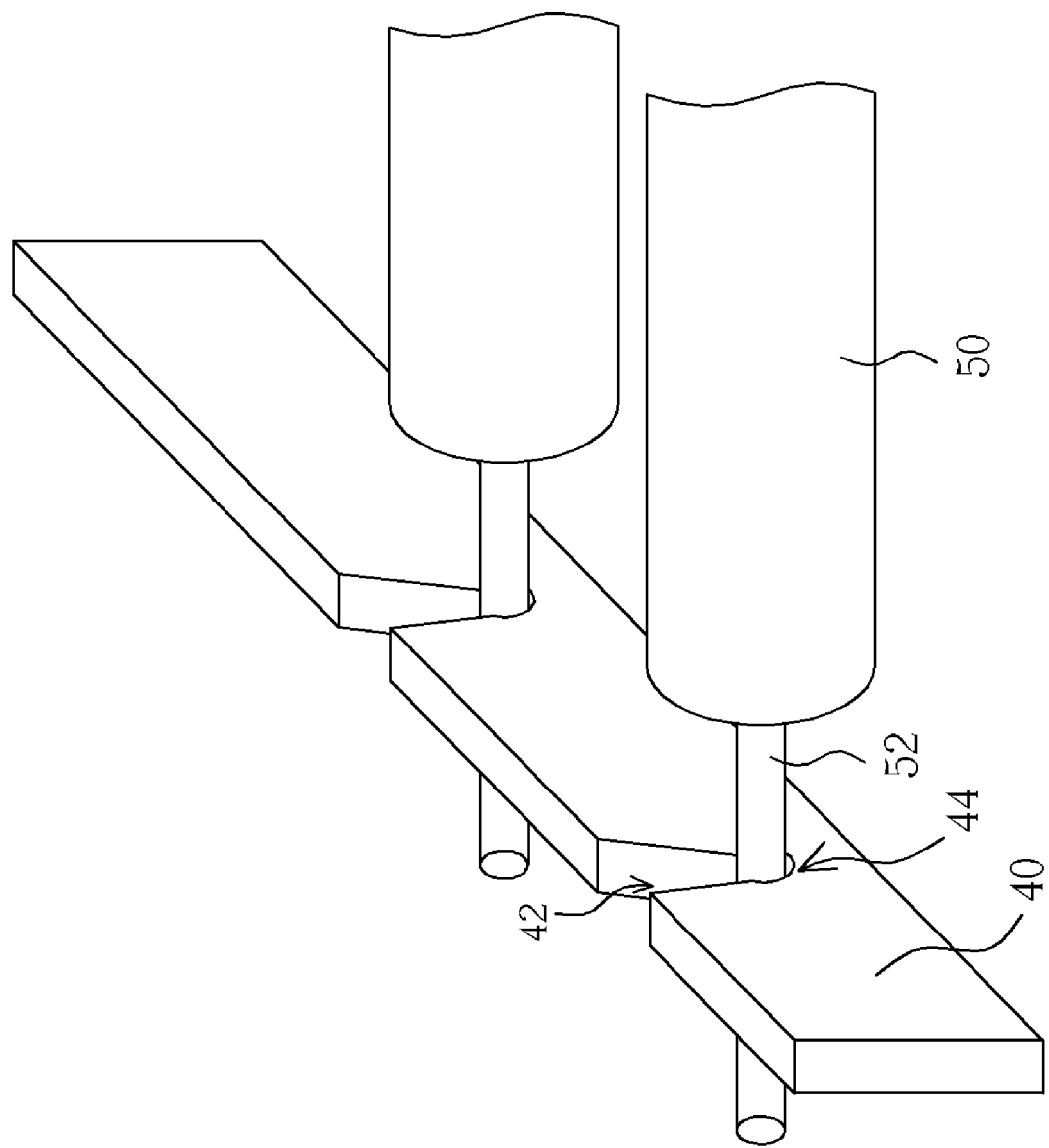
FIG. 4 illustrates a means of inserting a wick of the cold cathode fluorescent lamp into a printed circuit board according to an embodiment of the present invention.

Please refer to FIG. 4. FIG. 4 illustrates a means of inserting the wick 52 of the cold cathode fluorescent lamp 50 into the printed circuit board 40 according to an embodiment of the present invention. As shown in FIG. 4, when the wick 52 of the lamp 50 is placed against the v-shaped opening 42, a force can be applied to push the wick 52 into the c-shaped openings 44. Since the diameter d of the c-shaped opening 44 is greater than or equal to the diameter of the lamp 50, the wick 52 is securely placed in the c-shaped opening 44, thereby not easily detaching from the printed circuit board 40.

A soldering process can be performed thereafter to connect the wick 52 of the lamp 50 and the printed circuit board 40. Since the wick 52 of the lamp 50 is securely placed in the c-shaped opening 44, the present invention is able to effectively prevent the wick of the lamp from slipping out of the opening during the soldering process.

Figure 5:
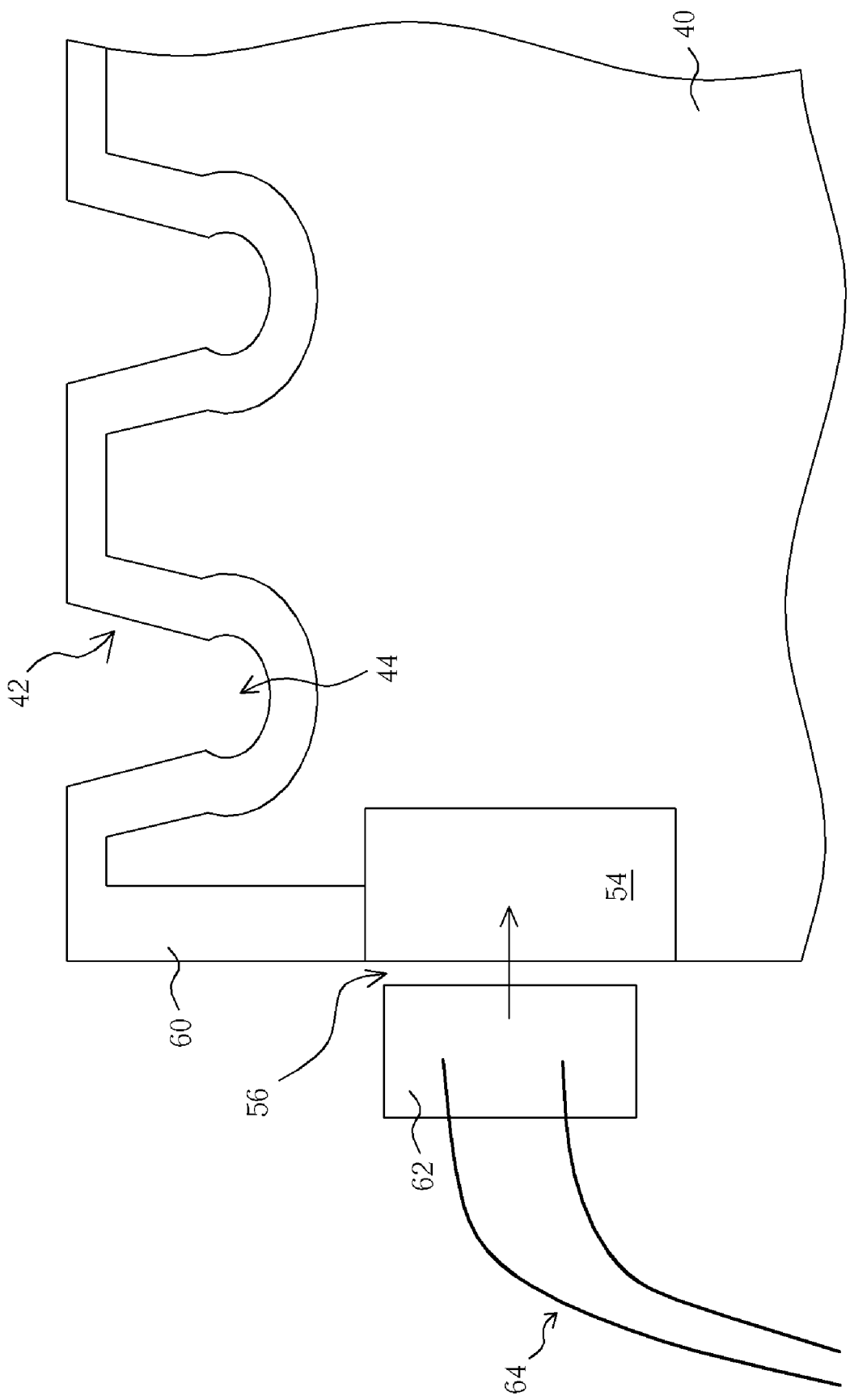
FIG. 5 and FIG. 6 illustrate a connecting unit for the wick of the cold cathode fluorescent lamp according to an embodiment of the present invention.
Figure 6:
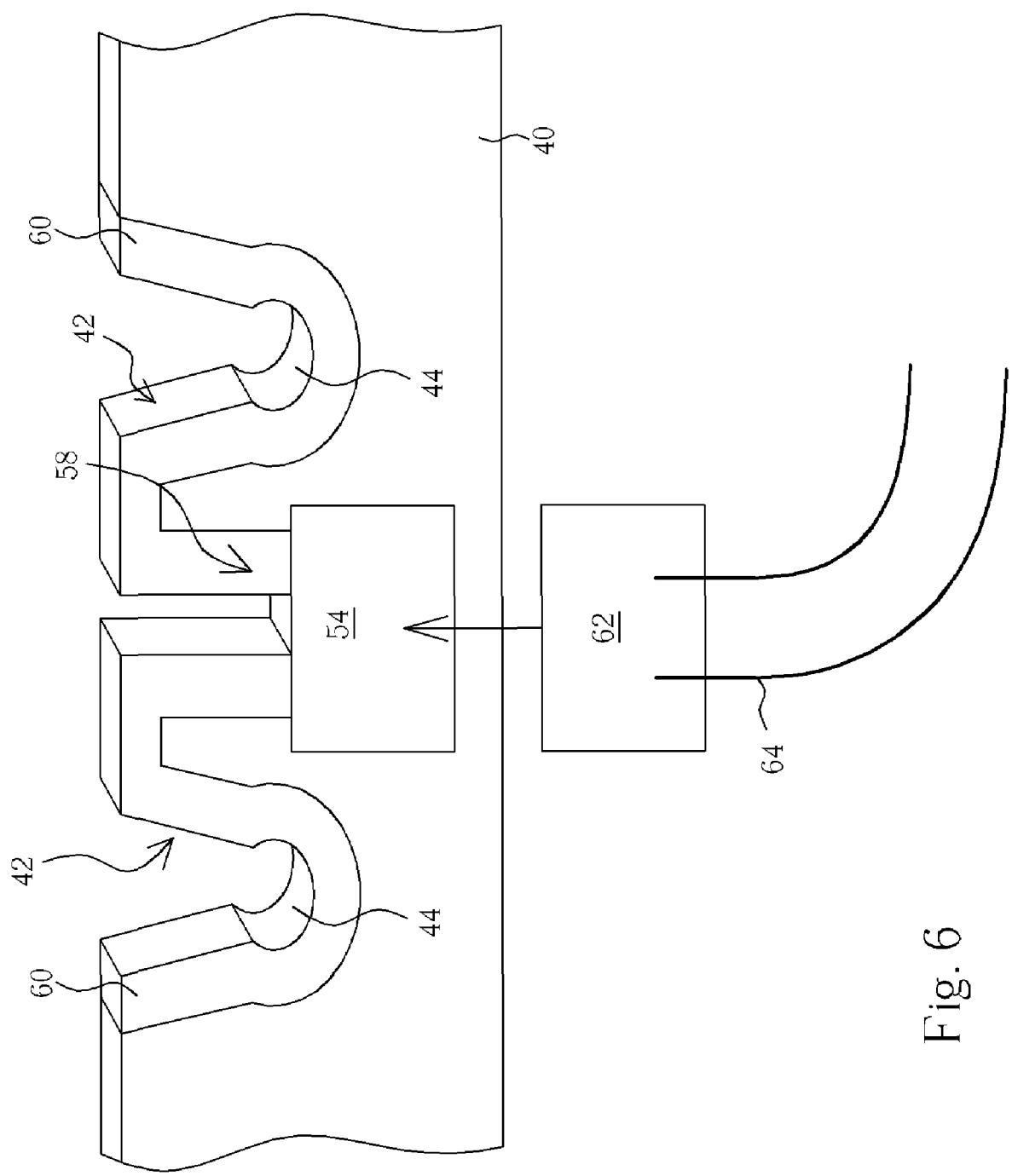

Please refer to FIG. 5 and FIG. 6. FIG. 5 and FIG. 6 illustrate a connecting unit for the wick of the cold cathode fluorescent lamp according to another embodiment of the present invention. As shown in FIG. 5, the connecting unit can also include a connector 54 disposed on a surface of the printed circuit board 40, in which the connector 54 is connected to the grounding end 56 of a plurality of lamps. Preferably, one end of the connector 54 is connected to the electrical circuits 60 surrounding the printed circuit board 40, which can be utilized to establish a connection for the wicks of a plurality of cold cathode fluorescent lamps. Additionally, an external connecting head 62 is provided to connect the connector 54 and a plurality of external wires 64 for serving as an input or output for the lamps.

As shown in FIG. 6, the connector 54 can also be connected to an anode end 58 of the lamp, in which the connector 54 is placed relatively between the two v-shaped openings 42 and the two c-shaped openings 44. The connector 54 is also connected to the electrical circuits 60 surrounding the printed circuit board 40. Similarly, an external connecting head 62 is provided to connect the connector 54 and the external wires 64 for serving as an input or output for the lamps.

In other words, the present invention can attach at least a connector either to the grounding end or the anode end of the connecting unit, in which the connector can be served as an input or an output end by connecting to the external connecting head and the external wires. It should be noted that by using this design, the damaged external wires can be repaired or replaced immediately.

In contrast to the conventional connecting unit for cold cathode fluorescent lamps, the present invention principally forms a v-shaped opening in a printed circuit board and a c-shaped opening connected to the end of the v-shaped opening. Specifically, after a lamp is placed on the v-shaped opening, a forced can be applied to push the wick of the lamp into the c-shaped opening. Since the diameter of the c-shaped opening is greater than or equal to the diameter of the wick, the position of the wick is secured after being pushed into the c-shaped opening. In other words, the connecting unit of the present invention not only improves the conventional design of having difficulty to extract the wick from the connecting unit, but also eliminates the problem of the wick being easily slipped out of the connecting unit. Additionally, a connector can be placed on the connecting unit with respect to the grounding end or the anode end of the lamps. The connector can be further connected to an external connecting head and a plurality of external wires and serving as an input or output for the lamps. By using this design, the damaged wires can be repaired or replaced immediately.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A connecting unit for accommodating a wick of a cold cathode fluorescent lamp, comprising:
a substrate having a conductive layer, a v-shaped opening, and a c-shaped opening, wherein the back end of the v-shaped opening is connected to the c-shaped opening, the width of the front end of the v-shaped opening is greater than the diameter of the wick, the width of the back end of v-shaped opening is less than the diameter of the c-shaped opening and the width of the wick, and the conductive layer is disposed on a surface of the c-shaped opening and the v-shaped opening.

2. The connecting unit for accommodating a wick of a cold cathode fluorescent lamp of claim 1, wherein the substrate is a printed circuit board.

3. The connecting unit for accommodating a wick of a cold cathode fluorescent lamp of claim 1 further comprising a PCB connecting circuit disposed on an edge of the substrate and electrically connected to the conductive layer disposed on the surface of the c-shaped opening.

4. The connecting unit for accommodating a wick of a cold cathode fluorescent lamp of claim 1, wherein the diameter of the c-shaped opening is greater than or equal to the diameter of the wick of the cold cathode fluorescent lamp.

5. The connecting unit for accommodating a wick of a cold cathode fluorescent lamp of claim 1 further comprising a connector disposed on the substrate and electrically connected to an anode end of the wick of the cold cathode fluorescent lamp.

6. The connecting unit for accommodating a wick of a cold cathode fluorescent lamp of claim 1 further comprising a connector disposed on the substrate and electrically connected to a grounding end of the wick of the cold cathode fluorescent lamp.

7. The connecting unit for accommodating a wick of a cold cathode fluorescent lamp of claim 1, wherein width of the front end of the v-shaped opening is about 10% to 50% greater than the diameter of the c-shaped opening.

8. The connecting unit for accommodating a wick of a cold cathode fluorescent lamp of claim 1, wherein the width of the front end of the v-shaped opening is about 10% to 50% greater than the diameter of the wick of the cold cathode fluorescent lamp.

9. The connecting unit for accommodating a wick of a cold cathode fluorescent lamp of claim 1, wherein the width of the back end of the v-shaped opening is about 0.5% to 10% less than the diameter of the c-shaped opening.

10. The connecting unit for accommodating a wick of a cold cathode fluorescent lamp of claim 1, wherein the width of the back end of the v-shaped opening is about 0.5% to 10% less than the diameter of the wick of the cold cathode fluorescent lamp.

* * * * *